US012716744B2

(12) United States Patent
Ray et al.

(10) Patent No.: US 12,716,744 B2
(45) Date of Patent: Aug. 25, 2026

(54) USAGE OF VIBRATION DATA FOR ROUTE PLANNING AND EXTENDING BATTERY PACK LIFETIME

(71) Applicant: VOLVO TRUCK CORPORATION, Gothenburg (SE)

(72) Inventors: Dripta Ray, Gothenburg (SE); Faisal Altaf, Västra Frölunda (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 104 days.

(21) Appl. No.: 18/537,363

(22) Filed: Dec. 12, 2023

(65) Prior Publication Data

US 2024/0200971 A1 Jun. 20, 2024

(30) Foreign Application Priority Data

Dec. 19, 2022 (EP) .................................... 22214614

(51) Int. Cl.

*G01C 21/00* (2006.01)
*B60L 58/16* (2019.01)
*G01C 21/34* (2006.01)
*G01R 31/392* (2019.01)

(52) U.S. Cl.

CPC .......... *G01C 21/3815* (2020.08); *B60L 58/16* (2019.02); *G01C 21/3461* (2013.01); *G01C 21/3841* (2020.08); *G01R 31/392* (2019.01); *B60L 2240/647* (2013.01)

(58) Field of Classification Search

CPC ........... G01C 21/3815; G01C 21/3841; G01C 21/3461; G01R 31/392; B60L 58/16; B60L 2240/647

USPC ......................................................... 701/450

See application file for complete search history.

(56) References Cited

U.S. PATENT DOCUMENTS

2016/0221446 A1 8/2016 Suzuki et al.
2022/0105829 A1* 4/2022 Nakagawa ........... G01R 31/367

FOREIGN PATENT DOCUMENTS

CN 108679160 A 10/2018
CN 113093041 A 7/2021
CN 113466731 A 10/2021
DE 102017206038 A1 10/2018

OTHER PUBLICATIONS

Extended European Search Report in corresponding European Application No. 22214604.5 dated May 31, 2023 (11 pages).
Extended European Search Report in corresponding European Application No. 22214614.4 dated May 31, 2023 (12 pages).

(Continued)

*Primary Examiner* — Mahmoud S Ismail
(74) *Attorney, Agent, or Firm* — Jeffri A. Kaminski; Venable LLP

(57) ABSTRACT

A computer-implemented method establishes map relating geographical location to vibration health impact on electrical energy storage systems adapted for providing propulsion power for a vehicle. A computer-implemented method improves a lifetime of an electrical energy storage system adapted for providing propulsion power for a vehicle when travelling on a route from an origin to a destination for accomplishing a mission.

5 Claims, 12 Drawing Sheets

(56) References Cited

OTHER PUBLICATIONS

Gianluca Caposciutti et al: "Analysis of SoH for Lithium Battery Cells operating under Vibration Stress", 2020 IEEE 7th International Workshop on Metrology for Aerospace (Metroaerospace), IEEE, Jun. 22, 2020, pp. 72-77, XP033802038, DOI: 10.1109/METROAEROSPACE48742.2020.9160101; 6 pages.
Zachary Bosire Omariba et al; "Parameter Identification and State Estimation of Lithium-Ion Batteries for Electric Vehicles with Vibration and Temperature Dynamics"; World Electric Vehicle Journal 2020, 11, 50; doi:10.3390/wevj11030050; www.mdpi.com/journal/wevj; 29 pages.

* cited by examiner

USAGE OF VIBRATION DATA FOR ROUTE PLANNING AND EXTENDING BATTERY PACK LIFETIME

CROSS-REFERENCE TO RELATED APPLICATIONS

This patent application claims priority to European Patent Application 22214614.4, filed Dec. 19, 2022, all of which is hereby incorporated by reference in its entirety.

TECHNICAL FIELD

The present disclosure relates to a method for improving a lifetime of an electrical energy storage system. The present disclosure also relates to a fleet management system, a control unit, and computer program. Although the method and system will be described in relation to a vehicle in the form of a truck, the method and system can also be efficiently incorporated in other vehicle types such as buses, light-weight trucks, passenger cars, construction equipment, marine vessels, and industrial equipment, as long as they are at least partly electrically propelled.

BACKGROUND

The performance of traction batteries in electric vehicles degrades over time due to various internal and external stress factors. For example, temperature, SoC windows, power levels, energy-throughput, have significant impact on ageing rate.

Traction batteries are relatively expensive, and it is therefore desirable to extend their lifetime as much as possible. In addition, replacement of traction batteries leads to unnecessary downtime of the electric vehicle. Further, the environmental impact of traction battery production should be minimized.

Accordingly, the present disclosure provides for improvements with regards to extending the lifetime of traction batteries for electric vehicles.

SUMMARY

The present disclosure aims to provide improvements with regards to improving the lifetime of an electrical energy storage system of a vehicle, or a fleet of vehicles.

According to the first aspect, there is provided a computer-implemented method for establishing map relating geographical location to vibration health impact on electrical energy storage systems adapted for providing propulsion power for a vehicle, the method comprising: estimating a present state of health of the electrical energy storage system; determining mechanical vibration magnitude and vibration frequency spectrum of the electrical energy storage system; determining location data indicating the location of the vehicle in a geographical area at which the mechanical vibration magnitude and vibration frequency spectrum of the electrical energy storage system occurred, determining a degree of impact of the vibrations of the electrical energy storage system on the state of health of the electrical energy storage system by processing the determined vibration magnitude and vibration frequency spectrum in a vibration-SOH model adapted to infer a relationship between vibration magnitude and vibration frequency spectrum, and state of health; accessing a map database having stored geographical locations with associated degrees of impact on the state of health of electrical energy storage systems, and updating the map database with the location data and the associated degree of impact at the location.

The vibration magnitude is indicative of the span, in unit length, of the vibration. Equally, the vibration magnitude may be the total power of the vibration during a short time period, or sample. The vibration spectrum is the power per unit frequency. That is, the power of the vibration as a function of frequency of the vibrations.

The vibration-SOH model is a model that is constructed based on cause-effect evaluations of the vibrations and how they affect the SOH. Thus, depending on the measured vibration magnitude and spectrum, the vibration-SOH model can quantify the impact that the vibrations have on the state of health of the electrical energy storage system. The vibration-SOH model is constructed with measured vibration and state of health data to build a correlation-based model, that is, an empirical relationship between vibration data collected over time, correlated with the effect the vibrations of the collected vibration data had on the SOH.

State of health, SOH, may be defined as the loss in capacity relative to a capacity at the beginning of life of the battery, or the internal resistance increase of the battery relative the internal resistance at the beginning of life of the battery. Further, state of health may equally be defined of loss in range, loss in peak acceleration capability, efficiency loss, loss in power-ability etc.

State of health parameters that may be measured for determining a state of health may include at least a state of capacity, a state of resistance, and/or state of power of the battery. These state of health parameters are well established and advantageously relatively straight-forward to measure and are typically available from automotive battery management systems (BMS).

State of charge, SOC, which is mentioned herein is the present level of charge in the electrical energy storage compared to its full capacity and may be given as a percentage value.

The propulsion electrical energy storage should be interpreted as providing propulsion energy to the vehicle. Thus, the vehicle may be an electrical, hybrid, or plug-in hybrid vehicle comprising an electrical engine, wherein the electrical energy storage provides power to the electrical engine for providing propulsion for the electrical, hybrid, or plug-in hybrid vehicle. The electrical energy storage may be Li-ion electrical energy storage comprising multiple cells arranged in series and in parallel as is known in the art.

The map database includes data with e.g., GPS coordinates of routes for specific missions. Some missions may have more than one possible route to accomplish the mission. A mission is to take a certain cargo from the origin to a destination, preferable at a given time and day. Further, the routes, or segments of the routes defined by GPS coordinates, or even individual GPS coordinates, are associated with respective vibration data collected by other vehicles that have travelled the same route. Based on the data in the map database, a route selection can be made that has the overall smallest impact on the SOH of the electrical energy storage system. Further, the selection of route can also be made in consideration of other SOH degrading factors such as power including speed and acceleration/deceleration profiles of the route, temperature evolution, total energy-throughput, SoC swing etc on each available route.

Overall, examples herein provide for a state of health-aware route planning of vehicles considering vibrations as one of the main stress factors.

Advantageously, the data in the map database may advantageously be continuously updated in real-time to improve the decisions regarding route selection.

The updated map data base may be made accessible to a vehicle fleet management system that selects a route and/or a mission for a vehicle by selecting a suitable route and/or mission for the present state of health of the electrical energy storage system of the vehicle.

In one example, the method may comprise: determining operating conditions including different sources that impact vibrations on the route, correlating the mechanical vibration magnitude and vibration frequency spectrum with the operating conditions to identify different sources of vibrations, determining the degree of impact of each of the different sources of vibrations by processing the determined vibration magnitude and vibration frequency spectrum in the vibration-SOH model, and updating the map database with data of the degree of impact of each of the different sources of vibrations at different locations. Operating conditions that affect vibrations may include road conditions (e.g., gravel, asphalt, friction conditions, roughness), the cargo type and weight, weather conditions. The SOH-vibration model is improved by the addition of the source information for some vibration characteristics. In other words, a correlation between different vibration spectrums, or specific frequency components and the sources thereof may be identified by the SOH-vibration model. Operating conditions may be detected from e.g., weather forecast data, manual input of cargo type and weight, image analysis of captured images from a camera of the vehicle, to mention a few examples.

It is envisaged that determining the vibration data can be performed by a measurement or by an estimation from secondary data, or a combination of a measurement and an estimation. In one example, the vibration data may be measured using a vibration sensor arranged on or near the electrical energy storage system or on an electrical energy storage cell, and the mechanical vibration magnitude and vibration frequency spectrum are determined from analysing the vibration data. Providing a separate and dedicated sensor for measuring the vibration advantageously allows for acquired accurate and specific data for the vibrations near or even directly on the electrical energy storage pack.

In a second aspect, there is provided a computer-implemented method for improving a lifetime of an electrical energy storage system adapted for providing propulsion power for a vehicle when travelling on a route from an origin to a destination for accomplishing a mission, the method comprising: estimating a present state of health of the electrical energy storage system; accessing a map database having stored geographical locations with associated degrees of impact on the state of health of electrical energy storage systems caused by vibrations of the electrical energy storage systems, selecting, from the map database, at least one of a route and a mission covering geographical locations stored in the map database, the at least one of a route and a mission is selected so that a degree of impact of the vibrations on the state of health of the electrical energy storage system minimized while still accomplishing the mission, and providing the at least one of a route and a mission to the vehicle.

Selecting a route or mission may be performed by evaluating entries of the map database in view of the present state of health of the electrical energy system. Thus, which combination of coordinates and associated impacts on the state of health suits the present vehicle best so that the SOH is not deteriorated excessively.

In one example, the method may be applied for a plurality of vehicles in a fleet, each vehicle being adapted to travel a respective route from an origin to a destination for accomplishing a respective mission, comprising: determining a degree of impact of the vibrations of each of the electrical energy storage systems on the state of health's of the respective electrical energy storage system, and selecting at least one of a route and a mission from the map database for each of the vehicles so that estimated state of health across the fleet once the missions are completed are more uniform than before the missions are initiated. In other words, vehicles may be shuffled on different routes to enable uniform aging of the electrical energy storage systems across of the fleet of vehicles.

In one example, once on a selected route and/or mission, determining mechanical vibration magnitude and vibration frequency spectrum of the electrical energy storage system; determining a degree of impact of the vibrations of the electrical energy storage system on the state of health of the electrical energy storage system by processing the determined vibration magnitude and vibration frequency spectrum in a vibration-SOH model adapted to infer a relationship between vibration magnitude and vibration frequency spectrum, and state of health, and adapting at least one vehicle control parameter to vary at least one of the vibration magnitude and the vibration frequency spectrum to reduce degree of impact of the vibrations of the electrical energy storage system using a control parameter-vibration model.

Thus, in order to further extend the lifetime of the electrical energy storage system the vibrations are actively controlled or reduced when travelling on the route during the mission.

In one example, reducing the degree of impact may include at least one of reducing the vibration magnitude and avoiding frequency components determined from the SOH-vibration model to have relatively larger impact on state of health. Thus, a frequency selection can be made based on prior knowledge to avoid harmful frequencies known to affect SOH more than others.

That is, adapting the at least one vehicle control parameter may include employing a control parameter-vibration model including at least one relationship between the at least one vehicle control parameter and the respective effect on the vibration magnitude and the vibration frequency of the electrical energy storage system. In other words, a second model may be used which provides, as an output, one or more control parameters to control the amount of adjustment that should be made to reduce the determined degree of impact of the vibrations. Such vibration model may also be constructed as an empirical model from measured vibration data collected when a known vehicle control parameter is adjusted, and by correlating that vibration data with the effect on the SOH. Adjusting the vehicle control parameter may aim to maintain a present SOH of the electrical energy storage device.

In one example, the at least one vehicle control parameter may include a speed profile, an acceleration profile, a gear-shifting strategy, a braking strategy including retardation braking, and steering control, and a dampening mechanism, of the vehicle.

In one example, the dampening mechanism may be a controllable local dampening mechanism for the electrical energy storage system. The local dampening may be an active dampening mechanism or adaptive dampening mechanism that is controllable by a processor device.

A local dampening mechanism may be combination of spring and shock-absorbing device whose stiffness and dampness can be controlled and that is installed between electrical energy storage devices and chassis i.e., the electrical energy storage device is not directly connected with chassis but through controllable damping mechanism. The damping mechanism thus isolates electrical energy storage device to some extent from vehicle structure and filter out vibrations originating from chassis.

It is also envisaged that vibrations can be dampened through dampers installed on vehicle level e.g., between vehicle axle and chassis. Those dampers in some cases can also be actively controlled i.e., stiffness and dampness coefficients can be adapted in real-time by a processor device.

In one example, adapting may comprise adapting a combination of at least two vehicle control parameters. In other words, two different mechanisms may be controlled in conjunction to reduce the degree of impact of the vibrations on the SOH of the electrical energy storage system.

In one example, one of the at least two vehicle control parameters may be a local dampening mechanism for the electrical energy storage system.

In one example, the vehicle control parameters are adapted in such a way that the vehicle mission can be accomplished. In other words, some vibrations may still be allowed, but the effect of the vibrations should be reduced as much as possible, while still being able to complete the mission including to arrive in-time. Other constraints may be, to ensure a predetermined driving experience, the driveability, passenger comfort, road speed limits, to mention a few examples.

It is envisaged that an outcome of the adaption of at least one vehicle control parameter on the state of health of the electrical energy storage system may be fed back to update the control parameter-vibration model that provides the adjusted vehicle control parameter. Thus, the control parameter-vibration model may advantageously be improved online to increase the accuracy of its estimations.

An electrical energy storage system may herein be considered a battery.

According to a third aspect there is provided a fleet management system configured to select a route and a mission for vehicles of a fleet, each vehicle comprising an electrical energy storage system, the fleet management system comprising: a memory storage to store a map database having stored routes and missions with associated degrees of impact of vibration of the electrical energy storage system on the state of health of the electrical energy storage system, the degrees of impact being pre-determined by processing a determined vibration magnitude and vibration frequency spectrum of energy storage systems in the fleet in a vibration-SOH model adapted to infer a relationship between vibration magnitude and vibration frequency spectrum, and state of health, a data input arrangement to receive present state of health of each electrical energy storage system of the fleet; and a control unit to select at least one of a route and a mission from the map database that reduces the overall determined degree of impact of the vibrations on the state of health of the electrical energy storage system in the fleet while still accomplishing the missions of the fleet.

In one example, the data input may be configured to receive location data indicating the location of a vehicle in a geographical area at which a mechanical vibration magnitude and vibration frequency spectrum of the electrical energy storage system occurred, and to receive a degree of impact of the vibrations of the electrical energy storage system on the state of health of the electrical energy storage system determined by processing the vibration magnitude and vibration frequency spectrum in a vibration-SOH model adapted to infer a relationship between vibration magnitude and vibration frequency spectrum, and state of health; wherein the control unit, in response to newly received location data accesses the map database and updates the map database with the location data and the associated degree of impact data for the location.

In one example, the control unit may be located in a server of a cloud-based system.

In one example, the control unit may be configured to store the vibration-SOH model on a memory storage accessible to the vehicles of the fleet.

According to a fourth aspect there is provided a computer program product comprising program code for performing, when executed by a processor device, the method of any one of the first aspect and the second aspect when said program is run on a computer.

According to a fifth aspect there is provided a non-transitory computer-readable storage medium comprising instructions, which when executed by the processor device, cause the processor device to perform the method of any one of the first aspect and the second aspect.

According to a sixth aspect there is provided a control unit configured to perform the steps of the method according to any one of the first aspect and the second aspect.

Effects and features of the second, third, fourth, fifth, and sixth aspects are largely analogous to those described above in relation to the first aspect.

Further features of, and advantages will become apparent when studying the appended claims and the following description. The skilled person will realize that different features may be combined to create embodiments other than those described in the following, without departing from the scope of the present disclosure.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Figure 1:
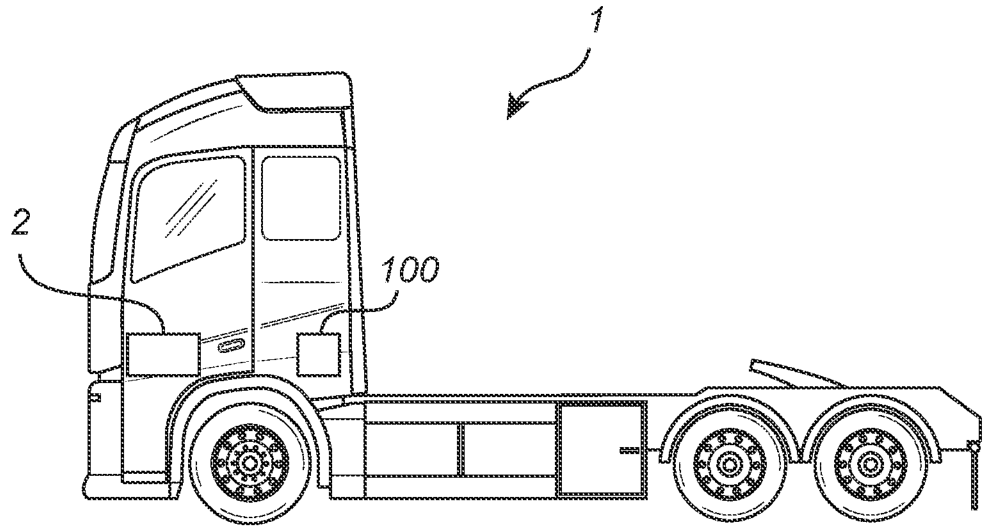
FIG. 1 is a vehicle in the form of an electrical truck according to examples of the disclosure.

The present invention will now be described more fully hereinafter with reference to the accompanying drawings, in which exemplary embodiments of the invention are shown. The invention may, however, be embodied in many different forms and should not be construed as limited to the embodiments set forth herein; rather, these embodiments are provided for thoroughness and completeness. The skilled person will recognize that many changes and modifications may be made within the scope of the appended claims.

Like reference character refer to like elements throughout the description.

FIG. 1 illustrates a vehicle in the form of an electrical truck 1 comprising a propulsion electrical energy storage system 2 generally comprising a plurality of series and parallel connected electrical energy storage cells. The propulsion electrical energy storage 2 is arranged to provide power to an electrical engine (not shown) arranged for providing propulsion for the electrical truck 1. The electrical truck 1 further comprises a system 100 system for establishing a map as will discussed in more detail herein. Generally, the vehicle comprises an electrical energy storage managing system which is configured to monitor electrical energy storage cell characteristics such as state of charge (SOC), state of health (SOH), state of power (SOP), state of energy (SOE), state of capacity (SOQ), etc., electrical energy storage voltage, state of resistance (SOR) i.e., internal impedance, and optionally temperature of the electrical energy storage cells. The propulsion electrical energy storage 2 may be a Li-ion electrical energy storage comprising multiple cells electrically connected in series and in parallel.

Although the vehicle in FIG. 1 is depicted as a heavy-duty truck, embodiments of the present disclosure may as well be implemented in other types of vehicles, such as in busses, light-weight trucks, passenger cars, construction equipment, industrial applications, and marine applications including e.g. vessels or ships.

Many factors that affect aging of electrical energy storage systems are known. The inventors realized that vibrations affect aging of electrical energy storage system and to alter or counteract the vibrations to reduce the effect on aging of the electrical energy storage system. For this, on-board assessment of vibrations of electrical energy storage system with respect to aging is discussed herein and that routes and missions are selected to reduce the overall aging rate of electrical energy storage systems of a fleet of vehicles.

Figure 2:
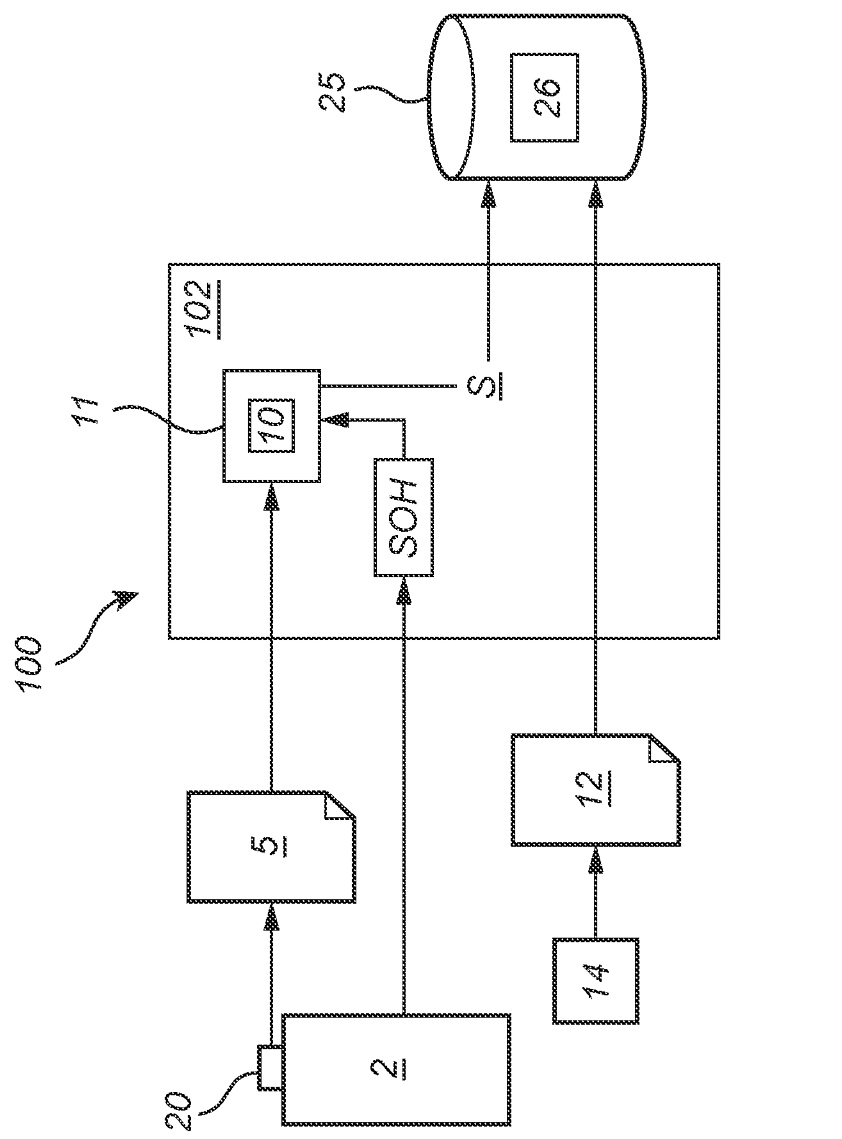
FIG. 2 is a block diagram of a system according to examples of the disclosure.
Figure 3:
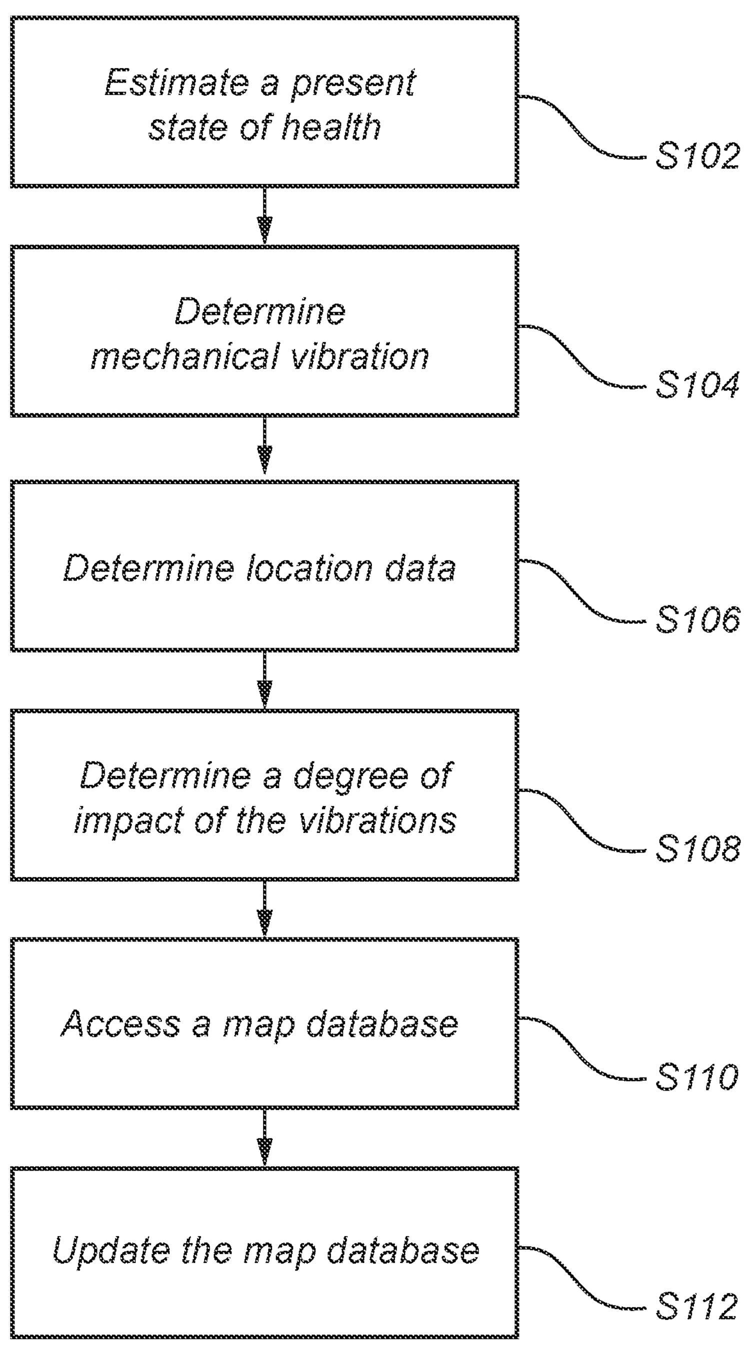
FIG. 3 is a flow-chart of method steps according to examples of the disclosure.

FIG. 2 is a block diagram of a system 100 according to examples described herein and FIG. 3 is a flow-chart of method steps.

In step S102 a present state of health, SOH, of the electrical energy storage system is estimated by a control unit 102. The SOH is determined from known measures but generally relates to loss in capacity relative to a capacity at the beginning of life of the battery, or the internal resistance increase of the battery relative the internal resistance at the beginning of life of the battery. Further, SOH may equally be defined of loss in range, loss in peak acceleration capability, efficiency loss, loss in power-ability etc. SOH is derived or calculated from current, voltage, and/or temperature measurements of the cells or packs of the electrical energy storage system. The estimated SOH is used as input to a vibration-SOH model 10 accessible by the control unit 102 in a memory 11.

In step S104, vibration data 5 including mechanical vibration magnitude and vibration frequency spectrum of the electrical energy storage system 2 is determined by the control unit 102. The control unit 102 analyses the vibration data 5 to extract the spectrum and the vibration magnitude using suitable tools, such as Fourier analysis or other spectrum analysis tools. The vibration data 5 are preferably measured using a vibration sensor 20 arranged on or near the electrical energy storage system 2 or on an electrical energy storage cell. The mechanical vibration magnitude and vibration frequency spectrum are determined by the control unit 102 from analysing the vibration data 5.

In step S106, the control unit 102 determines location data indicating the location of the vehicle 1 in a geographical area at which the mechanical vibration magnitude and vibration frequency spectrum of the electrical energy storage system occurred. The location data 12 may be acquired by a GPS 14 or another similar device.

In step S108, a degree of impact S of the vibrations of the electrical energy storage system 2 on the SOH of the electrical energy storage system 2 is determined by the control unit 102. For this, the control unit 102 processes the determined vibration magnitude and vibration frequency spectrum in a vibration-SOH model 10 adapted to infer a relationship between vibration magnitude and vibration frequency spectrum, and SOH.

The vibration-SOH model 10 is constructed from performing correlation between collected vibration data and the observed effect on the SOH to provide a cause-effect relationship. Preferably, the input vibration data includes full vibration power spectrum, i.e., vibration power magnitude at various frequencies. Further, other stress factors on SoH are decoupled and filtered before correlating SoH with vibration data otherwise to avoid associating all the ageing, that is, a reduction in SOH, with only vibrations.

When using the vibration-SOH model 10, the input vibration data 5 and the present SOH are correlated with the corresponding states in the vibration-SOH model 10. The output from the correlation provides basis for quantifying the impact of the vibration on the SOH. This may include filtering out those events from the collected vibration data 5 where vibration is affecting the state of health and to estimate or rank its magnitude in terms of impact as a stress factor.

In step S110, the control unit 102 accesses a map database 26 having stored data 26 of geographical locations with associated degrees of impact on the state of health of electrical energy storage systems. The control unit 102 transmits or transfers the data of the impact S and the location data 12, e.g., coordinates structured in a correlated way with the impacts S to the map database 26 which may be cloud-based, i.e., a server 25.

The map database 26 is thus updated in step S112 with the location data and the associated degree of impact at the location either by the control unit 112 having remote access to the server 25 or by another control unit.

Figure 4:
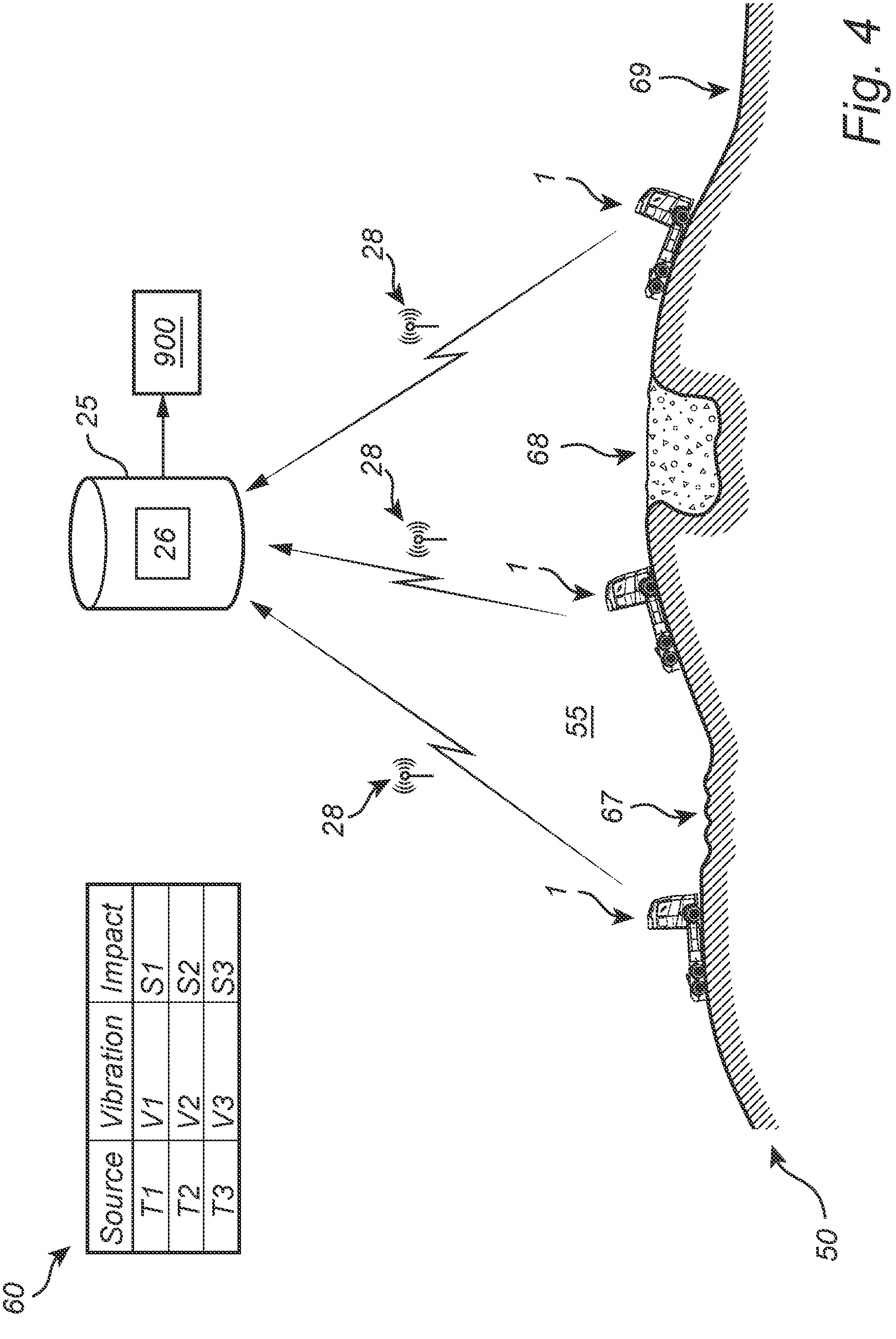
FIG. 4 is a schematic illustration of examples of the disclosure.

FIG. 4 illustrates a vehicle 1 travelling on a road 50 in a geographical area 55. Along the route where the vehicle 1 is travelling, there are different locations 67, 68, 69 where the road conditions may cause vibrations of different magnitude and spectrum that affect the state of health of the energy storage system 2 differently. While the vehicle 1 is travelling along the route 50, the control unit 102 of the vehicle 1 continuously access the server 25 via a communication network 28 to update the map database 26 with newly acquire location and SOH data 60.

In one example, the control unit 102 determines operating conditions T1, T2, T3 including different sources that impact vibrations on the route 50. Operating conditions may relate to road conditions such as whether different stretches 67, 68, and 69 are gravel, asphalt, of the friction conditions and roughness of the different stretches 67, 68, and 69 as schematically indicated in FIG. 4. Further operating conditions may be the cargo type and weight and weather conditions. The control unit 102 correlates the mechanical vibration magnitude and vibration frequency spectrum, V1, V2, V3 with the operating conditions to identify different sources of vibrations. The degree of impact of each of the different sources T1-T3 of vibrations are determined by processing the determined vibration magnitude and vibration frequency spectrum in the vibration-SOH model. The map database 26 is updated with data of the degree of impact S1. S2, S3 of each of the different sources of vibrations at different locations.

The updated map data base 26 is made accessible to a vehicle fleet management system that selects a route and/or a mission for a vehicle by selecting a suitable route and/or mission for the present state of health of the electrical energy storage system of the vehicle.

Figure 5:
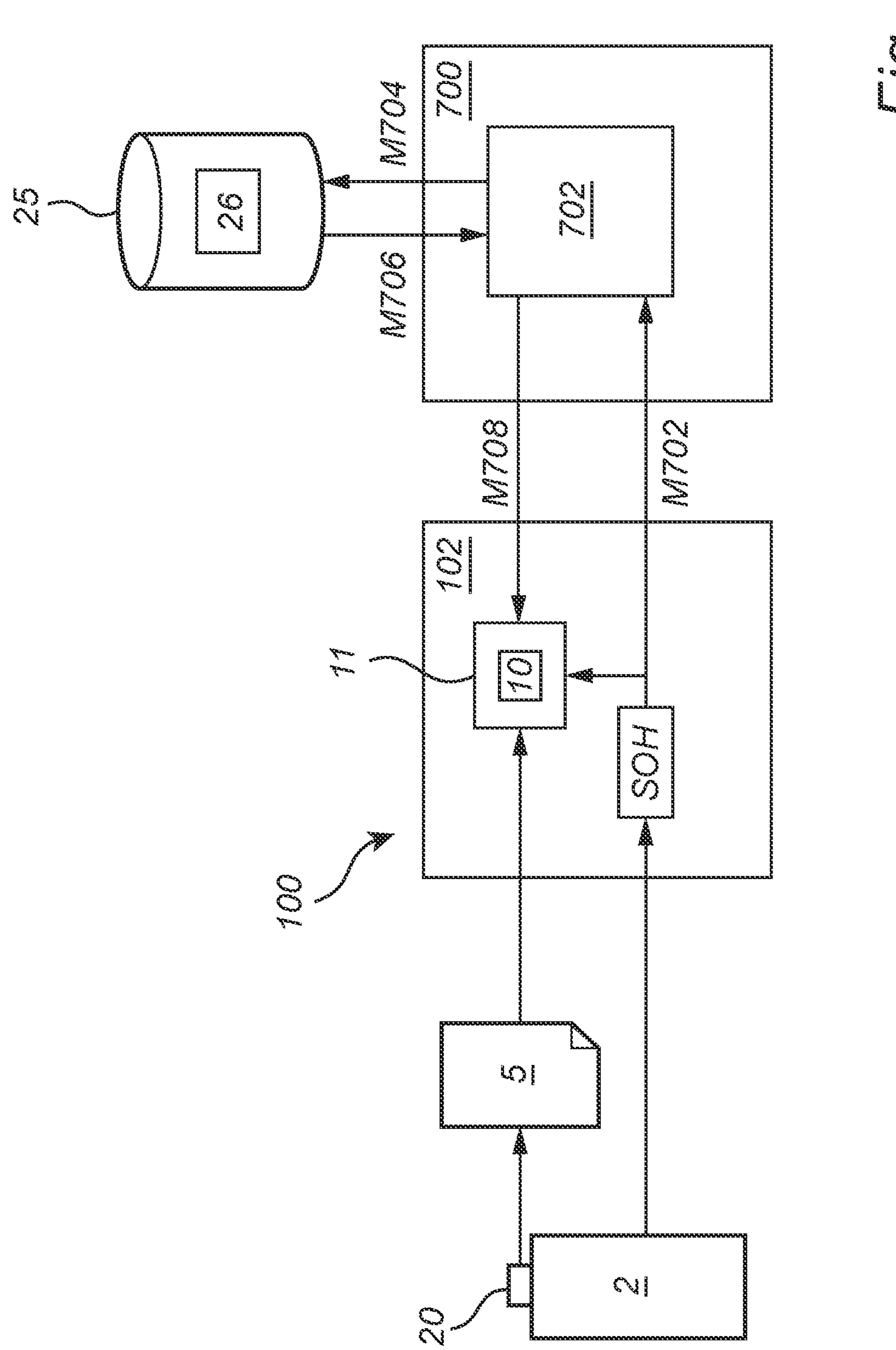
FIG. 5 is a block diagram of a system according to examples of the disclosure.
Figure 6:
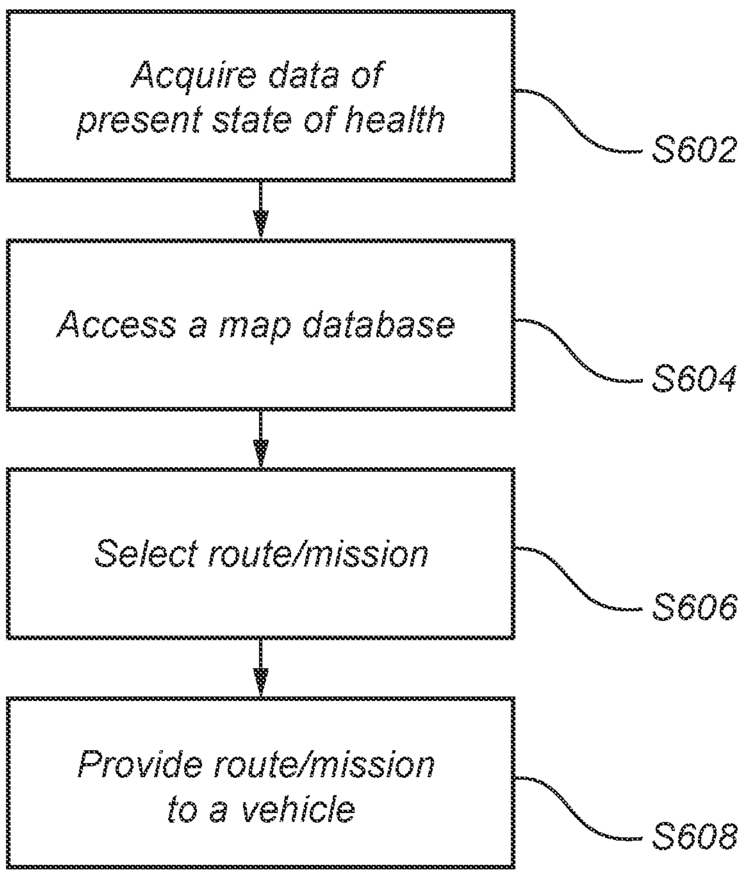
FIG. 6 is a flow-chart of method steps according to examples of the disclosure.

FIG. 5 is a block diagram including a fleet management system 700 according to examples described herein and FIG. 6 is a flow-chart of method steps.

In step S602, the control unit 702 of the vehicle fleet management system 700 acquires data of a present state of health of the electrical energy storage system 2 in message M702. The vehicle fleet management system 700 communicates through wireless communication with the vehicles and their control units 102.

In step S604, the control unit 702 accesses a map database 26 on the server 25 or memory storage 25 having stored geographical locations with associated degrees of impact on the state of health of electrical energy storage systems caused by vibrations of the electrical energy storage systems. The control unit 702 transmits an access request M704 with the SOH data to the server 26. The creation of such database 26 is described with reference to previous figures herein.

In step S606, the control unit 702 selects, from the map database 26, at least one of a route and a mission covering geographical locations stored in the map database. The at least one of a route and a mission is selected so that a degree of impact, S, of the vibrations on the state of health of the electrical energy storage system minimized while still accomplishing the mission. A message M706 is transmitted to the control unit 702 with the data of the selected route and/or mission.

In a subsequent step S608, the control unit 702 provides a message M708 to the vehicle comprising information of at least one of a route and a mission.

Figure 7:
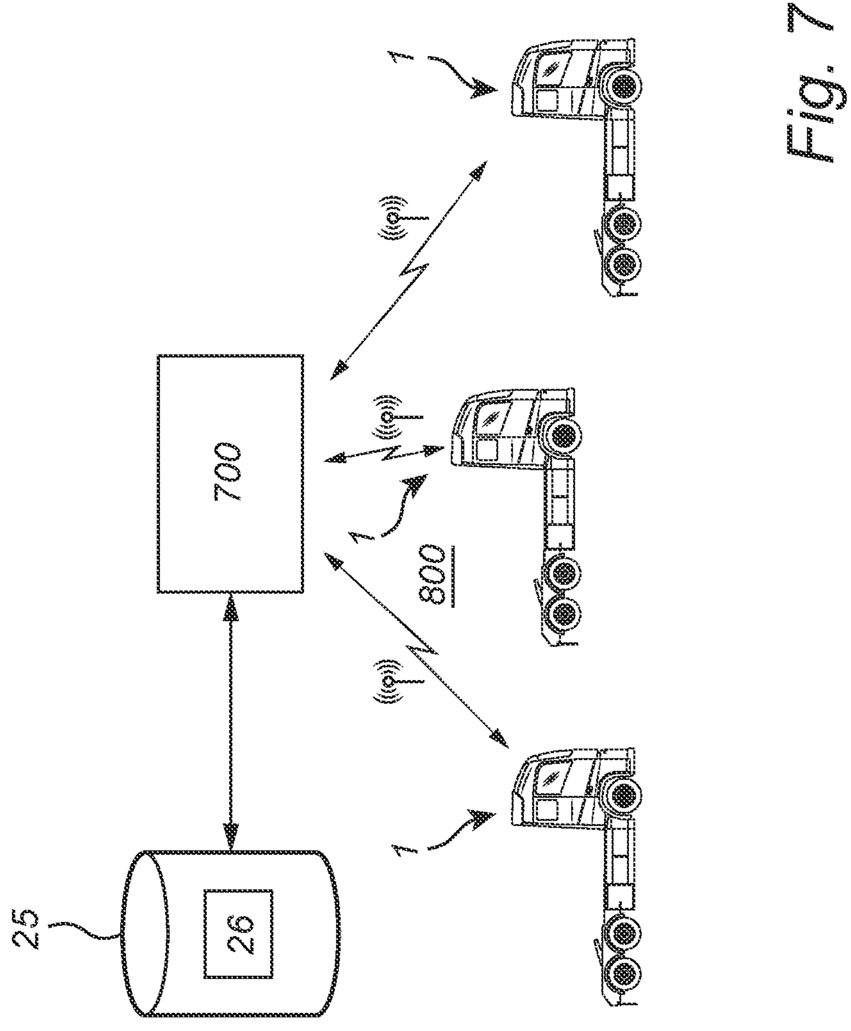
FIG. 7 is a schematic illustration of examples of the disclosure.

As schematically illustrated in FIG. 7, the method described with reference to FIGS. 5 and 6 is applied for a plurality of vehicles 1 in a fleet 800. Each vehicle 1 being adapted to travel a respective route from an origin to a destination for accomplishing a respective mission. The vehicles 1 communicate with the system 700 to transmit SOH data which the system correlates with the map database 26. In this way, the control unit 702 selects route and a mission from the map database 26 for each of the vehicles 1 so that estimated state of healths across the fleet once the missions are completed are more uniform than before the missions are initiated. In other words, the control unit of the system 700 selects routes and missions to shuffle vehicles so that some vehicles do not get worst operating conditions and hence reach their end-of-life much earlier than others.

Figure 8:
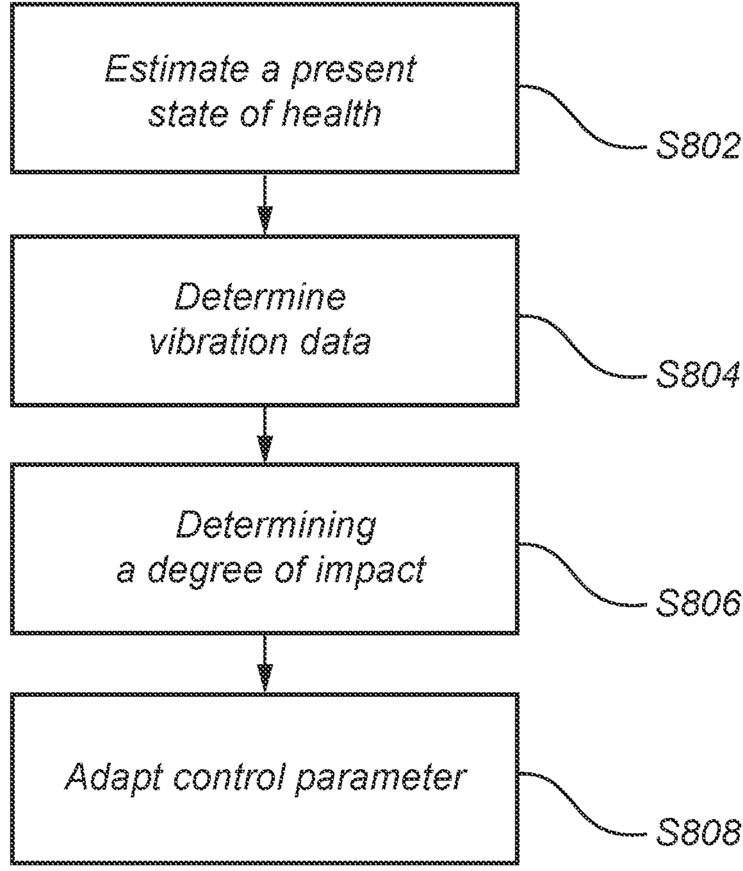
FIG. 8 is a flow-chart of method steps according to examples of the disclosure.
Figure 9:
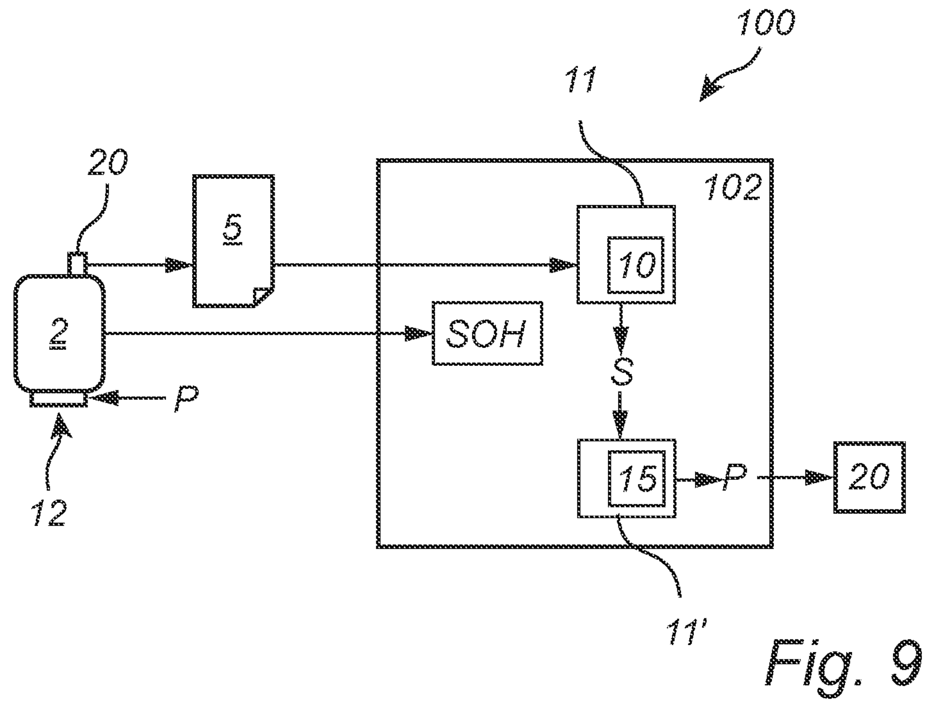
FIG. 9 is a block diagram of system according to examples of the disclosure.

In some examples, now turning to FIGS. 8 and 9, once a vehicle is on a selected route and/or mission, the control unit 102 of the vehicle 1 estimates a present state of health of its electrical energy storage system 2, in step S802.

In step S804, the control unit 102 determines mechanical vibration magnitude and vibration frequency spectrum of the electrical energy storage system.

In step S806, the control unit 102 determines a degree of impact of the vibrations of the electrical energy storage system on the state of health of the electrical energy storage system by processing the determined vibration magnitude and vibration frequency spectrum in a vibration-SOH model adapted to infer a relationship between vibration magnitude and vibration frequency spectrum, and state of health.

In step S808, at least one vehicle control parameter P is adapted by the control unit 102 to vary at least one of the vibration magnitude and the vibration frequency of the electrical energy storage system 2 to reduce the determined degree of impact of the vibrations of the electrical energy storage system.

The vehicle control parameter P may refer to many different ways of causing a counter vibration to reduce effect on the SOH caused by external vibrations. For example, a speed profile of the vehicle may be adapted to reduce vibrations. Adapting the speed profile is primarily used in a cruise control mode or self-driving mode of the vehicle and related to the absolute speed for individual stretches of an entire route, the average speed along the route, or specific combinations of speeds for stretches of the route. Similarly, an acceleration profile may be employed in a cruise control mode or self-driving mode of the vehicle. Other examples include a gear-shifting strategy, a braking strategy, steering control, and a dampening mechanism, of the vehicle.

A gear shifting strategy relates to which gears to use for the transmission of the vehicle along the route to ensure reduced vibrations. Braking strategy includes how aggressively to use the brakes of the vehicle, and to plan each braking operation to reduce vibrations. Steering control relates to turning radius and speed through turns. Dampening mechanism may be a local dampening at the electrical energy storage 2, or a more global dampening mechanism of the vehicle chassis. For example, the dampening mechanism may be a controllable local, active dampening mechanism 12, for the electrical energy storage system. The dampening mechanism 12 is controllable by the control unit 102 through suitable control messages.

A vehicle component 20 is controlled by the control unit by a control message transmitted from the control unit 102 to the vehicle component 20. The vehicle component 20 may be drive control system such as a cruise control system.

In examples, adapting the at least one vehicle control parameter includes employing a vibration model 15 including at least one relationship between the at least one vehicle control parameter and the respective effect on the vibration magnitude and the vibration frequency of the electrical energy storage system 2. The model 15 takes as input the degree of impact, S, as input. Evaluates the degree of impact, S, along with prestored relationships between given degree of impacts, S(1−n), and available vehicle control parameters. As an output the specific vehicle control parameter, P, or sets of vehicle control parameters, P(1−n) are provided, and to what extent they should be adapted. For example, a combination of at least two vehicle control parameters may be adapted, where one of the at least two vehicle control parameters is the local dampening mechanism 12 for the electrical energy storage system. The model 15 may be stored on the memory 11 or on a separate memory 11'.

The adaption of the vehicle control parameters may be subject to constraints. For example, the vehicle should be allowed to arrive at the destination in a reasonable time which often means that some degree of vibrations is acceptable. Further constraints may be to arrive in-time according to a set time, ensure a predetermined driving experience, the driveability of the vehicle, passenger comfort, road speed limits, to mention a few examples.

In one advantageous example, the vibration model is continuously updated. For this, a variation in vibration spectrum, i.e., power magnitude and frequency, is associated or correlated with the adaption in vehicle control parameter that caused the variation in vibration spectrum. The variation and cause may be fed back to the model 15 to improve its performance. Thus, the vibration model is continually updated using data-driven methods to learn which part of vibration spectrum is sensitive to which vehicle control parameter. Finding this sensitivity further improves adapting the vehicle control parameter to mitigate vibrations even further.

In a similar way, the vibration-SOH model 10 may be improved by correlating the variation in SOH to the variation in vibration magnitude and spectrum between consecutively acquired vibration data.

The methods disclosed herein are suitably performed while the vehicle is travelling. Furthermore, the method steps are preferably performed in a cruise control mode or self-driving mode of the vehicle.

Figure 10:
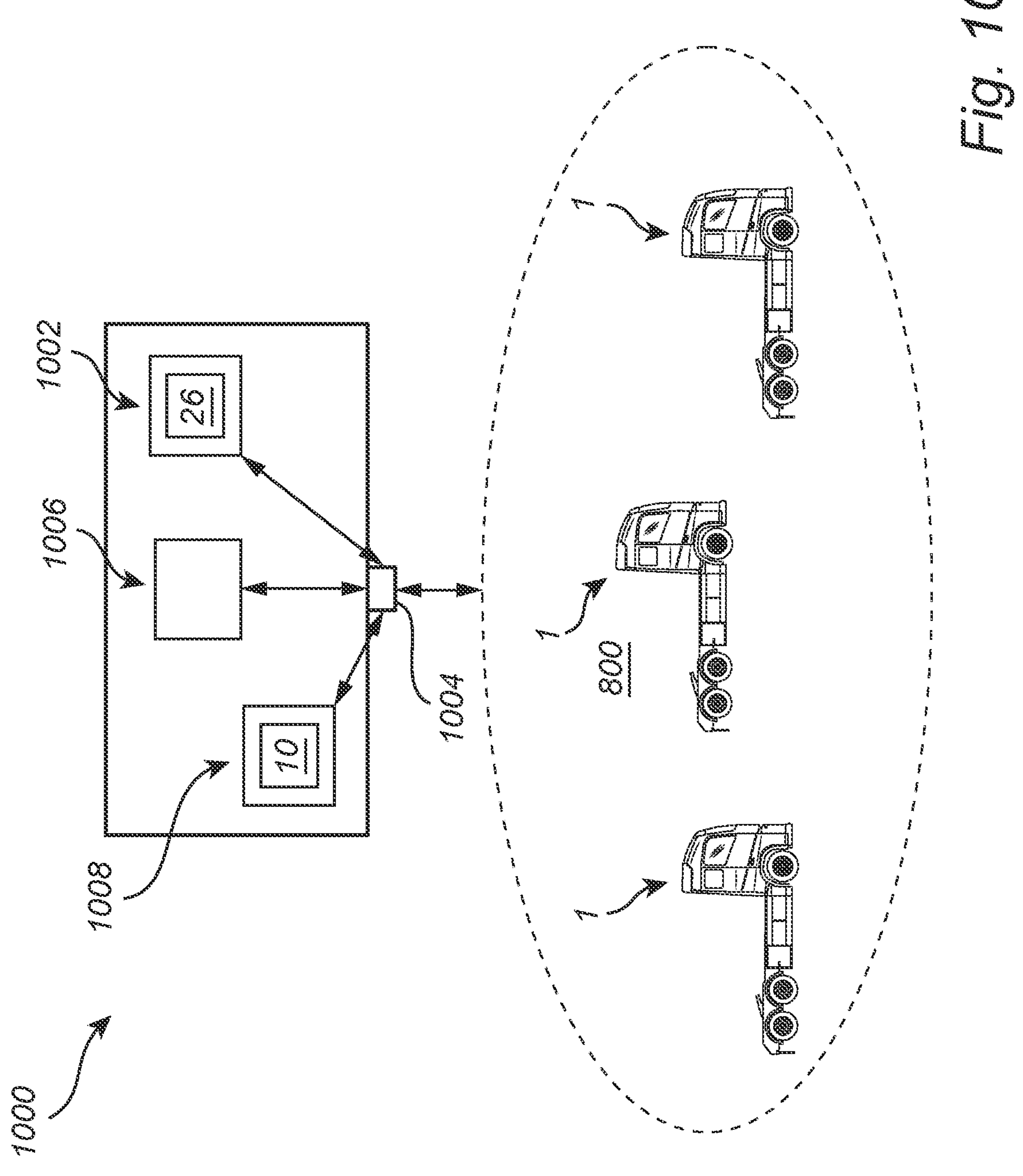
FIG. 10 is a block diagram of system according to examples of the disclosure.

FIG. 10 is a block diagram of a fleet management system 1000 configured to select a route and a mission for vehicles of a fleet 800. Each vehicle 1 comprising an electrical energy storage system 2.

The fleet management system 1000 comprises a memory storage 1002 to store a map database 26. The map database 26 stores stored routes and missions with associated degrees of impact of vibration of the electrical energy storage system on the state of health of the electrical energy storage system. As discussed above, the degrees of impact being predetermined by processing a determined vibration magnitude and vibration frequency spectrum of energy storage systems in the fleet in a vibration-SOH model adapted to infer a relationship between vibration magnitude and vibration frequency spectrum, and state of health.

The fleet management system 1000 comprises a data input arrangement 1004 to receive present state of health of each electrical energy storage system of the fleet. The data input arrangement 1004 may be a wireless data communication arrangement operating through wireless communication technology.

The fleet management system 1000 further comprises a control unit 1006 to select at least one of a route and a mission from the map database 26 that reduces the overall determined degree of impact of the vibrations on the state of health of the electrical energy storage system in the fleet while still accomplishing the missions of the fleet.

In the fleet management system, map data with vibration information is continuously monitored and updated in real-time to enable online optimal decisions regarding route selection for the vehicles of the fleet 800.

Decisions concerning route selection are made such that the "mean lifetime of batteries in a vehicle fleet" as well as "uniform ageing among batteries" is improved. The fairly uniform ageing level of batteries in a fleet will reduce the risk of so-called "weakest link in the chain problems" while managing fleet operations and logistics around it.

The data input 1004 may receive location data indicating the location of a vehicle 1 in a geographical area at which a mechanical vibration magnitude and vibration frequency spectrum of the electrical energy storage system occurred. The control unit 1006 may further receive, via the data input 1004 a degree of impact of the vibrations of the electrical energy storage system on the state of health of the electrical energy storage system determined by processing the vibration magnitude and vibration frequency spectrum in a vibration-SOH model 10 adapted to infer a relationship between vibration magnitude and vibration frequency spectrum, and state of health. The vibration-SOH model 10 may be stored on memory 1008 accessible to the control unit 1006.

The control unit 1006, in response to newly received location data accesses the map database and updates the map database with the location data and the associated degree of impact at the location.

The control unit 1006 may be located in a server of a cloud-based system. The vibration-SOH model may be stored on a memory storage accessible to the vehicles of the fleet.

There is further provided a computer program product comprising program code for performing, when executed by a processor device, when said program is run on a computer: estimating a present state of health of the electrical energy storage system; determining vibration data including mechanical vibration magnitude and vibration frequency spectrum of the electrical energy storage system; determining location data indicating the location of the vehicle in a geographical area at which the mechanical vibration magnitude and vibration frequency spectrum of the electrical energy storage system occurred, determining a degree of impact of the vibrations of the electrical energy storage system on the state of health of the electrical energy storage system by processing the determined vibration magnitude and vibration frequency spectrum in a vibration-SOH model adapted to infer a relationship between vibration magnitude and vibration frequency spectrum, and state of health, accessing a map database having stored geographical locations with associated degrees of impact on the state of health of electrical energy storage systems, and updating the map database with the location data and the associated degree of impact at the location.

There is further provided a non-transitory computer-readable storage medium comprising instructions, which when executed by the processor device, cause the processor device to: determining vibration data including mechanical vibration magnitude and vibration frequency spectrum of the electrical energy storage system; determining location data indicating the location of the vehicle in a geographical area at which the mechanical vibration magnitude and vibration frequency spectrum of the electrical energy storage system occurred, determining a degree of impact of the vibrations of the electrical energy storage system on the state of health of the electrical energy storage system by processing the determined vibration magnitude and vibration frequency spectrum in a vibration-SOH model adapted to infer a relationship between vibration magnitude and vibration frequency spectrum, and state of health, accessing a map database having stored geographical locations with associated degrees of impact on the state of health of electrical energy storage systems, and updating the map database with the location data and the associated degree of impact at the location.

There is further provided a computer program product comprising program code for performing, when executed by a processor device, when said program is run on a computer: acquiring data of a present state of health of the electrical energy storage system; accessing a map database having stored geographical locations with associated degrees of impact on the state of health of electrical energy storage systems caused by vibrations of the electrical energy storage systems, selecting, from the map database, at least one of a route and a mission covering geographical locations stored in the map database, the at least one of a route and a mission is selected so that a degree of impact of the vibrations on the state of health of the electrical energy storage system minimized while still accomplishing the mission; and providing the at least one of a route and a mission to the vehicle.

There is further provided a non-transitory computer-readable storage medium comprising instructions, which when executed by the processor device, cause the processor device to: acquire data of a present state of health of the electrical energy storage system; access a map database having stored geographical locations with associated degrees of impact on the state of health of electrical energy storage systems caused by vibrations of the electrical energy storage systems, select, from the map database, at least one of a route and a mission covering geographical locations stored in the map database, the at least one of a route and a mission is selected so that a degree of impact of the vibrations on the state of health of the electrical energy storage system minimized while still accomplishing the mission; and provide the at least one of a route and a mission to the vehicle.

Figure 11:
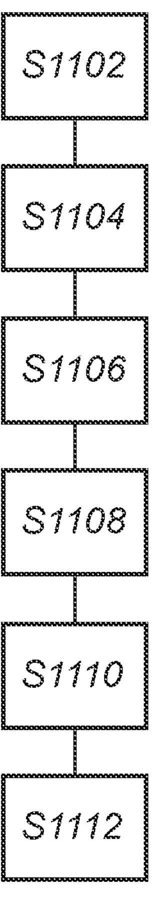
FIG. 11 is a flow-chart of method steps according to examples of the disclosure.

FIG. 11 is a flow chart of an exemplary method.

Estimating, in step S1102, a present state of health of the electrical energy storage system Determining, in step S1104, mechanical vibration magnitude and vibration frequency spectrum of the electrical energy storage system.

Determining, in step S1106, location data indicating the location of the vehicle in a geographical area at which the mechanical vibration magnitude and vibration frequency spectrum of the electrical energy storage system occurred.

Determining, in step S1108, a degree of impact (S) of the vibrations of the electrical energy storage system on the state of health of the electrical energy storage system by processing the determined vibration magnitude and vibration frequency spectrum in a vibration-SOH model adapted to infer a relationship between vibration magnitude and vibration frequency spectrum, and state of health.

Accessing, in step S1110, a map database having stored geographical locations with associated degrees of impact on the state of health of electrical energy storage systems.

Updating, in step S1112, the map database with the location data and the associated degree of impact at the location.

Figure 12:
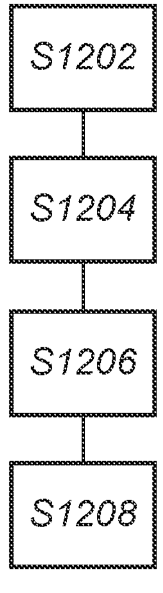
FIG. 12 is a flow-chart of method steps according to examples of the disclosure.

FIG. 12 is a flow chart of an exemplary method.

Acquiring, in step S1202, data of a present state of health of the electrical energy storage system.

Accessing, in step S1204, a map database having stored geographical locations with associated degrees of impact on the state of health of electrical energy storage systems caused by vibrations of the electrical energy storage systems.

Selecting, in step S1206, from the map database, at least one of a route and a mission covering geographical locations stored in the map database, the at least one of a route and a mission is selected so that a degree of impact of the vibrations on the state of health of the electrical energy storage system minimized while still accomplishing the mission.

Providing, in step S1208 the at least one of a route and a mission to the vehicle.

Figure 13:
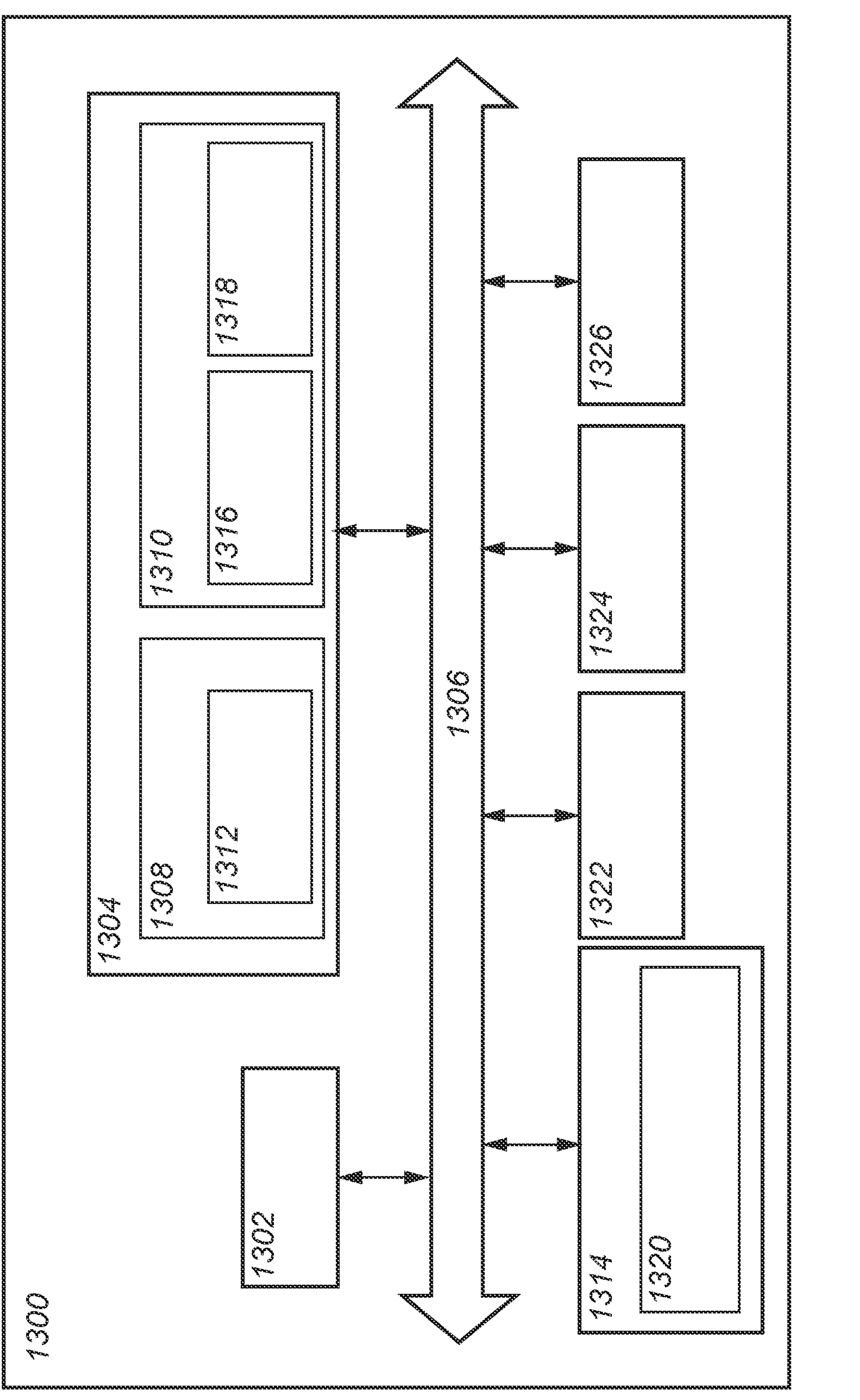
FIG. 13 is a schematic diagram of an exemplary computer system for implementing examples disclosed herein, according to one example.

FIG. 13 is a schematic diagram of a computer system 1300 for implementing examples disclosed herein. The computer system 1300 is adapted to execute instructions from a computer-readable medium to perform these and/or any of the functions or processing described herein. The computer system 1300 may be connected (e.g., networked) to other machines in a LAN, an intranet, an extranet, or the Internet. While only a single device is illustrated, the computer system 1300 may include any collection of devices that individually or jointly execute a set (or multiple sets) of instructions to perform any one or more of the methodologies discussed herein. Accordingly, any reference in the disclosure and/or claims to a computer system, computing system, computer device, computing device, control system, control unit, electronic control unit (ECU), processor device, etc., includes reference to one or more such devices to individually or jointly execute a set (or multiple sets) of instructions to perform any one or more of the methodologies discussed herein. For example, control system may include a single control unit or a plurality of control units connected or otherwise communicatively coupled to each other, such that any performed function may be distributed between the control units as desired. Further, such devices may communicate with each other or other devices by various system architectures, such as directly or via a Controller Area Network (CAN) bus, etc.

The computer system 1300 may comprise at least one computing device or electronic device capable of including firmware, hardware, and/or executing software instructions to implement the functionality described herein. The computer system 1300 may include a processor device 1302 (may also be referred to as a control unit), a memory 1304, and a system bus 1306. The computer system 1300 may include at least one computing device having the processor device 1302. The system bus 1306 provides an interface for system components including, but not limited to, the memory 1304 and the processor device 1302. The processor device 1302 may include any number of hardware components for conducting data or signal processing or for executing computer code stored in memory 1304. The processor device 1302 (e.g., control unit) may, for example, include a general-purpose processor, an application specific processor, a Digital Signal Processor (DSP), an Application Specific Integrated Circuit (ASIC), a Field Programmable Gate Array (FPGA), a circuit containing processing components, a group of distributed processing components, a group of distributed computers configured for processing, or other programmable logic device, discrete gate or transistor logic, discrete hardware components, or any combination thereof designed to perform the functions described herein. The processor device may further include computer executable code that controls operation of the programmable device.

The system bus 1306 may be any of several types of bus structures that may further interconnect to a memory bus (with or without a memory controller), a peripheral bus, and/or a local bus using any of a variety of bus architectures. The memory 1304 may be one or more devices for storing data and/or computer code for completing or facilitating methods described herein. The memory 1304 may include database components, object code components, script components, or other types of information structure for supporting the various activities herein. Any distributed or local memory device may be utilized with the systems and methods of this description. The memory 1304 may be communicably connected to the processor device 1302 (e.g., via a circuit or any other wired, wireless, or network connection) and may include computer code for executing one or more processes described herein. The memory 1304 may include non-volatile memory 1308 (e.g., read-only memory (ROM), erasable programmable read-only memory (EPROM), electrically erasable programmable read-only r memory (EEPROM), etc.), and volatile memory 1310 (e.g., random-access memory (RAM)), or any other medium which can be used to carry or store desired program code in the form of machine-executable instructions or data structures and which can be accessed by a computer or other machine with a processor device 1302. A basic input/output system (BIOS) 1312 may be stored in the non-volatile memory 1308 and can include the basic routines that help to transfer information between elements within the computer system 1300.

The computer system 1300 may further include or be coupled to a non-transitory computer-readable storage medium such as the storage device 1314, which may comprise, for example, an internal or external hard disk drive (HDD) (e.g., enhanced integrated drive electronics (EIDE) or serial advanced technology attachment (SATA)), HDD (e.g., EIDE or SATA) for storage, flash memory, or the like. The storage device 1314 and other drives associated with computer-readable media and computer-usable media may provide non-volatile storage of data, data structures, computer-executable instructions, and the like. A number of modules can be implemented as software and/or hard-coded in circuitry to implement the functionality described herein in whole or in part. The modules may be stored in the storage device 1314 and/or in the volatile memory 1310, which may include an operating system 1316 and/or one or more program modules 1318. All or a portion of the examples disclosed herein may be implemented as a computer program product 1320 stored on a transitory or non-transitory computer-usable or computer-readable storage medium (e.g., single medium or multiple media), such as the storage device 1314, which includes complex programming instructions (e.g., complex computer-readable program code) to cause the processor device 1302 to carry out the steps described herein. Thus, the computer-readable program code can comprise software instructions for implementing the functionality of the examples described herein when executed by the processor device 1302. The processor device 1302 may serve as a controller or control system for the computer system 1300 that is to implement the functionality described herein.

The computer system 1300 also may include an input device interface 1322 (e.g., input device interface and/or output device interface). The input device interface 1322 may be configured to receive input and selections to be communicated to the computer system 1300 when executing instructions, such as from a keyboard, mouse, touch-sensitive surface, etc. Such input devices may be connected to the processor device 1302 through the input device interface 1322 coupled to the system bus 1306 but can be connected through other interfaces such as a parallel port, an Institute of Electrical and Electronic Engineers (IEEE) 1394 serial port, a Universal Serial Bus (USB) port, an IR interface, and the like. The computer system 1300 may include an output device interface 1324 configured to forward output, such as to a display, a video display unit (e.g., a liquid crystal display (LCD) or a cathode ray tube (CRT)). The computer system 1300 may also include a communications interface 1326 suitable for communicating with a network as appropriate or desired.

The operational steps described in any of the exemplary aspects herein are described to provide examples and discussion. The steps may be performed by hardware components, may be embodied in machine-executable instructions to cause a processor to perform the steps, or may be performed by a combination of hardware and software. Although a specific order of method steps may be shown or described, the order of the steps may differ. In addition, two or more steps may be performed concurrently or with partial concurrence.

The terminology used herein is for the purpose of describing particular aspects only and is not intended to be limiting of the disclosure. As used herein, the singular forms "a," "an," and "the" are intended to include the plural forms as well, unless the context clearly indicates otherwise. As used herein, the term "and/or" includes any and all combinations of one or more of the associated listed items. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure.

Relative terms such as "below" or "above" or "upper" or "lower" or "horizontal" or "vertical" may be used herein to describe a relationship of one element to another element as illustrated in the Figures. It will be understood that these terms and those discussed above are intended to encompass different orientations of the device in addition to the orientation depicted in the Figures. It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this disclosure belongs. It will be further understood that terms used herein should be interpreted as having a meaning consistent with their meaning in the context of this specification and the relevant art and will not be interpreted in an idealized or overly formal sense unless expressly so defined herein.

It is to be understood that the present disclosure is not limited to the aspects described above and illustrated in the drawings; rather, the skilled person will recognize that many changes and modifications may be made within the scope of the present disclosure and appended claims. In the drawings and specification, there have been disclosed aspects for purposes of illustration only and not for purposes of limitation, the scope of the inventive concepts being set forth in the following claims.

The invention claimed is:

1. A computer-implemented method for establishing map relating geographical location to vibration health impact on electrical energy storage systems adapted for providing propulsion power for a vehicle, the method comprising:

estimating, by a control unit, a present state of health of the electrical energy storage system;

determining, by the control unit, mechanical vibration magnitude and vibration frequency spectrum of the electrical energy storage system;

determining, by the control unit, location data indicating a location of the vehicle in a geographical area at which the mechanical vibration magnitude and vibration frequency spectrum of the electrical energy storage system occurred, determining, by the control unit, a degree of impact of the vibrations of the electrical energy storage system on the state of health of the electrical energy storage system by processing the determined vibration magnitude and vibration frequency spectrum in a vibration-SOH model adapted to infer a relationship between vibration magnitude and vibration frequency spectrum, and state of health;

accessing, by the control unit, a map database having stored geographical locations with associated degrees of impact on the state of health of electrical energy storage systems, and updating, by the control unit, the map database with the location data and the associated degree of impact at the location.

2. The method according to claim 1, comprising:

determining, by the control unit, operating conditions including different sources that impact vibrations on a route, correlating, by the control unit, the mechanical vibration magnitude and vibration frequency spectrum with the operating conditions to identify different sources of vibrations, determining, by the control unit, the degree of impact of each of the different sources of vibrations by processing the determined vibration magnitude and vibration frequency spectrum in the vibration-SOH model, and updating, by the control unit, the map database with data of the degree of impact of each of the different sources of vibrations at different locations.

3. The method according to claim 1, wherein vibration data are measured using a vibration sensor arranged on, in, or near the electrical energy storage system, and the mechanical vibration magnitude and vibration frequency spectrum are determined from analysing the vibration data.

4. The method according to claim 1, wherein the updated map data base is made accessible to a vehicle fleet management system that selects a route and/or a mission for a vehicle by selecting a suitable route and/or mission for the present state of health of the electrical energy storage system of the vehicle.

5. A non-transitory computer-readable storage medium comprising instructions, which when executed by a processor device, cause the processor device to perform the method of claim 1.

* * * * *